United States Patent [19]

Johns

[11] 4,413,262

[45] Nov. 1, 1983

[54] MULTIPLE FREQUENCY TUNED CIRCUIT

[76] Inventor: Robert H. Johns, 3379 Papermill Rd., Huntingdon Valley, Pa. 19006

[21] Appl. No.: 327,359

[22] Filed: Dec. 4, 1981

Related U.S. Application Data

[63] Continuation-in-part of Ser. No. 249,440, Mar. 31, 1981, Pat. No. 4,334,228, which is a continuation-in-part of Ser. No. 222,241, Jan. 2, 1981, Pat. No. 4,335,386, which is a continuation-in-part of Ser. No. 162,928, Jul. 17, 1980.

[51] Int. Cl.[3] .......................... H03H 7/00; H01Q 1/00

[52] U.S. Cl. ...................................... 343/722; 333/175

[58] Field of Search ................ 343/722, 749; 333/175, 333/185

[56] References Cited

U.S. PATENT DOCUMENTS

| | | | |
|---|---|---|---|
| 3,560,895 | 2/1971 | Matsumoto | 333/175 |
| 4,255,728 | 3/1981 | Doty | 333/185 |

*Primary Examiner*—Eli Lieberman

[57] ABSTRACT

A circuit having several resonant frequencies is disclosed, using the interwinding capacitance between layers of coils for the tuned circuit capacitors. The use of such multiple frequency circuits as antenna traps is shown.

4 Claims, 3 Drawing Figures

MULTIPLE FREQUENCY TUNED CIRCUIT

CROSS-REFERENCES

This application is a continuation in part of my application Ser. No. 249,440 filed Mar. 31, 1981, now U.S. Pat. No. 4,334,228, which is a continuation in part of my application Ser. No. 222,241 filed Jan. 2, 1981, now U.S. Pat. No. 4,335,386, which is a continuation in part of my application Ser. No. 162,928 filed July 17, 1980.

SUMMARY OF THE INVENTION

This invention provides a simple circuit that uses only coils with no separate capacitor components, which is resonant on several frequencies simultaneously. The capacitance between coils wound in layers is used to resonate the circuit to the desired frequencies. The entire circuit, with all coils and distributed capacitances, is resonant at the lowest frequency. A higher frequency resonance is achieved utilising the inductance of a small coil wound around the larger main coils, together with the capacitance between this smaller coil and the main coils. A third resonant frequency may be obtained by the inclusion of another small coil inside the main coils. The capacitance between this coil and the main coils is also employed to resonate this coil. All the resonant frequencies mentioned above are parallel resonances. In addition, a series resonant frequency exists between each pair of poles, or parallel tuned circuits, since these appear inductive below resonance and capacitive above resonance. At the cross-over point between poles, the circuit exhibits no reactance, a series resonance.

Very simple and inexpensive circuits may be built according to this invention. They may be used for interstage coupling in radiofrequency amplifiers, as antenna traps, and for many applications in the frequency and time domain.

PRIOR ART

Circuits using separate coil and capacitor components that have multiple resonances are well known, as shown by Pichitino in U.S. Pat. No. 2,898,590. Circuits having a single parallel resonant frequency employing the interwinding capacity between bifilar and trifilar coils to tune the circuit are shown by U.S. Pat. Nos. Doty, 4,255,728, and Matsumoto, 3,560,895. Single frequency antenna traps and also traps and antenna wound from a continuous length of wire that employ bifilar coils with no separate capacitor are disclosed in my copending applications 222,241 filed Jan. 2, 1981, and 249,440 filed Mar. 31, 1981.

The simplicity of the present invention offers very great savings in cost, size, weight, and number of components over the prior art multiple tuned circuits. This invention also provides significant new results not offered by prior art single frequency resonant circuits that do not use separate capacitors. One new result is an antenna trap that enables the inner segment of a trap antenna to be resonant on its odd harmonics. Another new result is an antenna trap operating on several frequencies that also permits antenna currents of a frequency between trap parallel resonant frequencies to pass through the trap without having the trap "load" or add reactance to the antenna at that frequency.

DETAILED DESCRIPTION OF THE INVENTION

Figure 1:
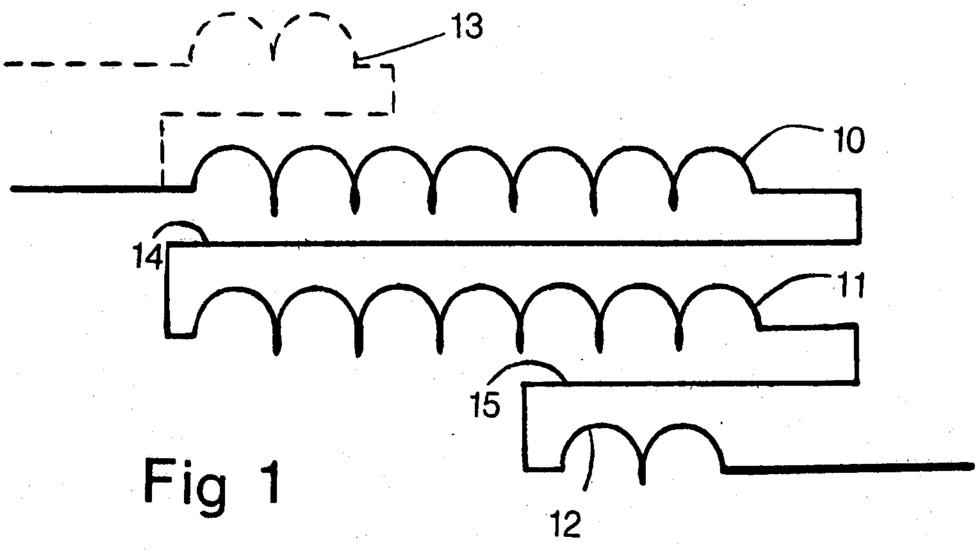
FIG. 1 is a circuit diagram of this invention.

In FIG. 1, two main bifilar coils 10 and 11 are shown with an electrical cross-connection wire 14 joining opposite ends. Coil 10 may be the inner coil with coil 11 wound around it, or the two coils may be wound with the turns of one between the turns of the other. They need not be of precisely the same number of turns, and a layered structure with one coil outside the other is preferred. A smaller coil 12 is wound around the main coils near one end of the main coils, with a cross-connection wire 15 placing it in series with the main coils. Insulated wire must be used for the coils, and the wire insulation becomes the dielectric of the circuit capacitors, the capacitance between the layers of coils.

The total inductance of all three coils in parallel with the sum of all the interwinding capacitances produces the lowest resonant frequency of the circuit. The higher frequency resonance is produced by coil 12 and part of coil 11 near it, together with the capacitance between them. Another small coil 13 may be wound inside coil 10 to produce a third parallel resonant frequency.

Figure 2:
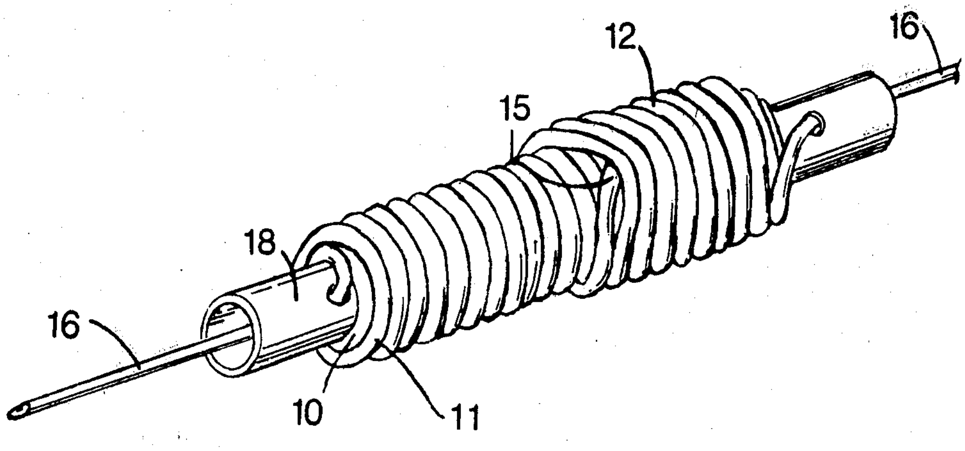
FIG. 2 is a perspective view of a multiple frequency circuit according to this invention installed as a trap in a wire antenna.

In FIG. 2 the numbered parts correspond to those in FIG. 1. FIG. 2 shows the multiple frequency tuned circuit installed in an antenna to form a multiband trap. Coil 10 is wound on an insulating trap form 18, and coil 11 surrounds coil 10. Cross-connection wire 14 between main coils 10 and 11 is not visible in FIG. 2 since it may pass down the inside of the form 18. Cross-connection wire 15 between coils 11 and 12 was first laid along the coil 11 and then coil 12 wrapped over it. These coils should all be in a series-aiding relationship so that their mutual inductances add to or aid their self inductances. The antenna trap is supported by segments of antenna wire 16 on either side of the trap.

Figure 3:
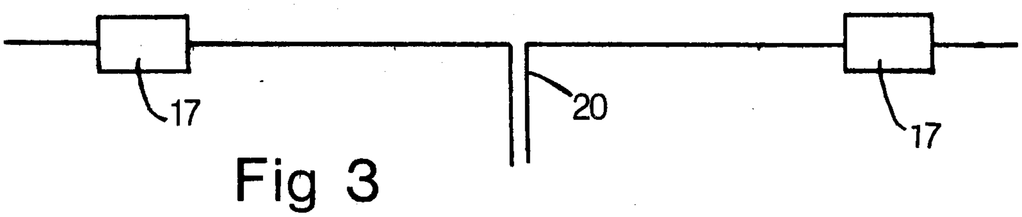
FIG. 3 is a diagram of an antenna with multiple frequency circuits installed as traps in the antenna.

In FIG. 3 a trap dipole antenna is shown, center fed by transmission line 20. Antenna traps 17 serve to isolate the center segments of the antenna at the resonant frequency of the traps. In the usual installation, this center portion is a half wave dipole. If the multiple frequency tuned circuits of this invention are used as the antenna traps, additional operating frequencies are possible with this antenna. For example, if the antenna is a half wave for the 80 meter band overall, traps are commonly inserted that are resonant on the 40 meter band. If the traps 17 are tuned to 7 MHz and 21 MHz the center portion of the antenna will be resonant as a half wave dipole on 40 meters and as a three half waves dipole on 15 meters. When one frequency band is an odd harmonic of another, they both may be operated on the same trapped segment of antenna by means of this invention. There are many short wave broadcast bands and amateur bands that are so related.

In high voltage or high power circuits, the wire insulation must have adequate thickness and dielectric properties. I have found a thickness of 1/32 inch of cross-linked polyethylene insulation able to withstand peak rf voltages in excess of 2000 volts. Circuits wound on a cylindrical form $\frac{7}{8}$ inch in diameter having 28 turns for the first coil, 27 turns for the second coil, and 10½ turns for the third coil, all coils being wound from #14 stranded copper wire with 1/32 inch cross-linked polyethylene insulation, had resonant frequencies of 7.2 MHz and 21.4 MHz.

If the several coils in the multiple frequency tuned circuit are wound from a continuous length of wire, the circuit is more likely to give trouble-free service, since failures due to connections will be eliminated. These connections inside a resonant circuit can cause difficulty, since large circulating currents flow at resonance. These points are where antenna traps commonly weather and fail. With this invention, an antenna including multiband traps may be wound from a continuous length of wire for weatherproof construction.

The higher frequency resonances cannot be brought down near the low frequency resonance. If small coils 12 or 13 are made larger in an effort to lower their frequency, their resonance becomes less pronounced and more broad, and eventually disappears. This appears when the number of turns in the smaller coil approaches the number in the main coils. For best results, with sharp, high Q resonances, the number of turns in either of the smaller coils should be less than half the number of turns in either of the main coils. The inductive coupling between the small coil and the main coils must be limited or else the small coil is drawn in to be part of the overall resonant circuit.

I claim:

1. A circuit having more than one resonant frequency comprising a main bifilar winding of two capacitively coupled wire coils with an electrical cross-connection between opposite ends of said main coils, the turns of said coils being insulated from one another and one coil located outside the other, a third coil having fewer than half the turns of wire than either of said main coils, capacitively coupled to one of said main coils near an end thereof, with an electrical cross-connection between the end of the main coil to which the third coil is capacitively coupled and the opposite end of said third coil.

2. A multiple frequency circuit according to claim 1 in which said third coil is positioned outside said main coils.

3. A multiple frequency circuit according to claim 1 in which said third coil is positioned inside said main coils.

4. A multiple frequency circuit according to claim 1 in which said cross-connections between coils are continuations of said coil windings, whereby the entire circuit is made from a continuous length of wire.

* * * * *